(12) United States Patent
Standing (10) Patent No.: US 9,559,056 B2
(45) Date of Patent: Jan. 31, 2017

(54) ELECTRONIC COMPONENT

(71) Applicant: Infineon Technologies Austria AG, Villach (AT)

(72) Inventor: Martin Standing, Velden (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/489,707

(22) Filed: Sep. 18, 2014

(65) Prior Publication Data

US 2016/0086881 A1    Mar. 24, 2016

(51) Int. Cl.

| | |
|---|---|
| *H01L 23/495* | (2006.01) |
| *H01L 29/15* | (2006.01) |
| *H01L 29/66* | (2006.01) |
| *H01L 23/48* | (2006.01) |
| *H01L 23/528* | (2006.01) |
| *H01L 23/31* | (2006.01) |
| *H01L 23/367* | (2006.01) |
| *H01L 29/20* | (2006.01) |
| *H01L 29/778* | (2006.01) |
| *H01L 23/482* | (2006.01) |
| *H01L 23/00* | (2006.01) |

(52) U.S. Cl.
CPC ......... *H01L 23/528* (2013.01); *H01L 23/3107* (2013.01); *H01L 23/367* (2013.01); *H01L 24/19* (2013.01); *H01L 24/20* (2013.01); *H01L 23/4824* (2013.01); *H01L 24/05* (2013.01); *H01L 29/2003* (2013.01); *H01L 29/778* (2013.01); *H01L 2224/02375* (2013.01); *H01L 2224/02379* (2013.01); *H01L 2224/02381* (2013.01); *H01L 2224/04105* (2013.01); *H01L 2224/18* (2013.01); *H01L 2224/2413* (2013.01)

(58) Field of Classification Search
CPC ............. H01L 21/568; H01L 23/49517; H01L 23/49575; H01L 23/3107; H01L 24/49; H01L 2924/01023; H01L 23/528; H01L 24/19; H01L 24/20; H01L 24/05; H01L 23/4824; H01L 29/2003; H01L 29/778; H01L 2224/02375; H01L 2224/02379; H01L 2224/02381; H01L 2224/04105; H01L 2224/18
USPC ......... 257/330, 666, 676, 76, 194, 289, 690, 257/E23.037, 751, 773, 503, 686, 700; 438/123, 285, 121, 653
See application file for complete search history.

(56) References Cited

U.S. PATENT DOCUMENTS

| | | |
|---|---|---|
| 7,745,848 B1 | 6/2010 | Rajagopal et al. |
| 8,592,974 B2 | 11/2013 | Wu |
| 8,624,662 B2 | 1/2014 | Parikh et al. |
| 8,648,643 B2 | 2/2014 | Wu |

(Continued)

FOREIGN PATENT DOCUMENTS

EP    2458630 A2    5/2012

*Primary Examiner* — Dzung Tran
(74) *Attorney, Agent, or Firm* — Murphy, Bilak & Homiller, PLLC (57) ABSTRACT

In an embodiment, an electronic component includes a dielectric core layer having a first major surface, a semiconductor die embedded in the dielectric core layer, and a first conductive layer. The semiconductor die includes a first major surface and at least two conductive fingers arranged on the first major surface which are coupled to a common potential. The first conductive layer is arranged on, and electrically coupled to, the at least two conductive fingers and extends from the at least two conductive fingers over the first major surface of the dielectric core layer.

23 Claims, 10 Drawing Sheets

(56) References Cited

U.S. PATENT DOCUMENTS

| | | |
|---|---|---|
| 2004/0178495 A1* | 9/2004 | Yean et al. .................... 257/723 |
| 2004/0245608 A1* | 12/2004 | Huang et al. ................. 257/676 |
| 2006/0151868 A1 | 7/2006 | Zhu et al. |
| 2006/0175627 A1 | 8/2006 | Shiraishi |
| 2007/0272957 A1* | 11/2007 | Johnson et al. .............. 257/289 |
| 2007/0296077 A1* | 12/2007 | Moline ......................... 257/712 |
| 2009/0109646 A1 | 4/2009 | Kizilyalli et al. |
| 2009/0215230 A1* | 8/2009 | Muto et al. ................... 438/124 |
| 2010/0091477 A1* | 4/2010 | Takagi et al. ................. 361/820 |
| 2010/0182755 A1* | 7/2010 | Maejima et al. ............. 361/748 |
| 2011/0193206 A1 | 8/2011 | Galera et al. |
| 2012/0032296 A1 | 2/2012 | Kosaka et al. |
| 2012/0086497 A1 | 4/2012 | Vorhaus |
| 2013/0199832 A1 | 8/2013 | Galster et al. |
| 2014/0054604 A1 | 2/2014 | Ritenour |

\* cited by examiner

ELECTRONIC COMPONENT

BACKGROUND

An electronic component may include one or more semiconductor devices in a package. The package includes internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections.

SUMMARY

In an embodiment, an electronic component includes a dielectric core layer having a first major surface, a semiconductor die embedded in the dielectric core layer, the semiconductor die including a first major surface and at least two conductive fingers arranged on the first major surface which are coupled to a common potential and a first conductive layer arranged on, and electrically coupled to, the at least two conductive fingers and extending from the at least two conductive fingers over the first major surface of the dielectric core layer.

In an embodiment, an electronic component includes means for electrically coupling at least two conductive fingers arranged on a first surface of a semiconductor die embedded in a dielectric core layer, the at least two conductive fingers being coupled to a common potential, the means for electrically coupling extending from the at least two conductive fingers over the first major surface of the dielectric core layer.

In an embodiment, a method of producing an electronic component includes applying a first conductive layer to at least two conductive fingers arranged on a first surface of a semiconductor die embedded in a dielectric core layer, the at least two conductive fingers being coupled to a common potential, the first conductive layer extending from the at least two conductive fingers over the first major surface of the dielectric core layer.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1b illustrates a cross-sectional view along the line A-A of the electronic component illustrated in FIG. 1a.

FIG. 2b illustrates a cross-sectional view along the line B-B of the electronic component illustrated in FIG. 2a.

FIG. 2c illustrates a cross-sectional view along the line C-C of the electronic component illustrated in FIG. 2a.

FIG. 2d illustrates a cross-sectional view along the line D-D of the electronic component illustrated in FIG. 2a.

FIG. 2e illustrates a cross-sectional view along the line E-E of the electronic component illustrated in FIG. 2a.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" or "over" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1A:
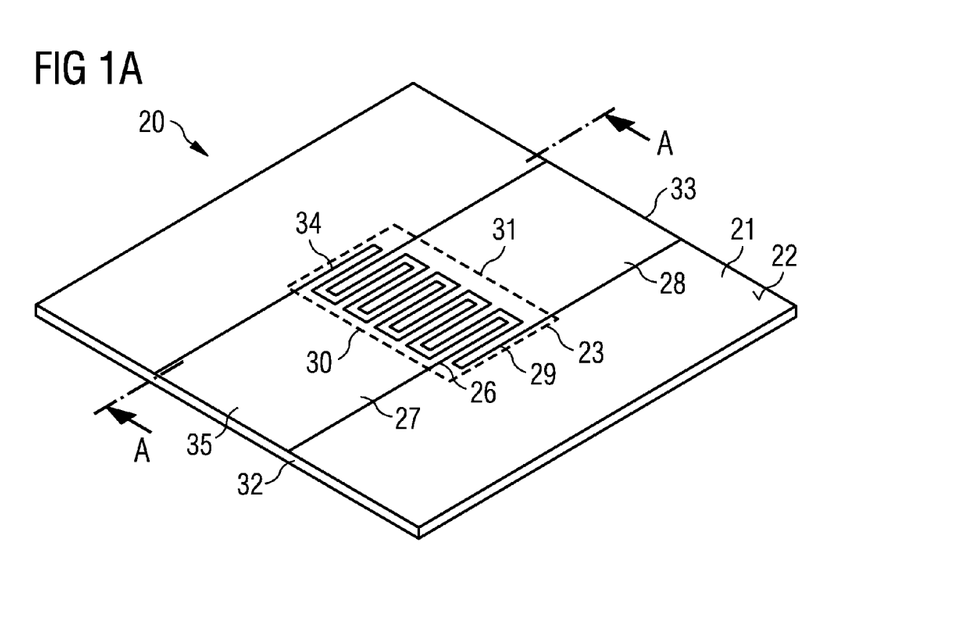
FIG. 1a illustrates a perspective view of an electronic component according to a first embodiment.
Figure 1B:
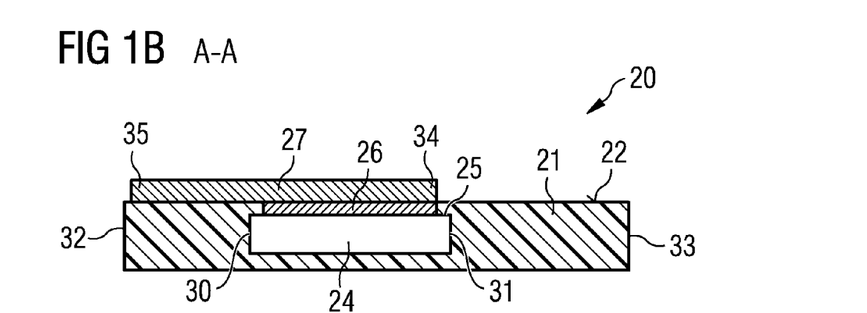

FIG. 1a illustrates a perspective view of an electronic component 20 according to a first embodiment and FIG. 1b illustrates a cross-sectional view along the line A-A of the electronic component 20.

The electronic component 20 includes a dielectric core layer 21 including a first major surface 22 and a semiconductor die 24 which is embedded in the dielectric core layer 21. The position of the semiconductor die 24 is indicated in the perspective view of FIG. 1a with the dashed line 23. As can be seen in the cross-sectional view of FIG. 1b, the semiconductor die 24 includes a first major surface 25 which includes at least two conductive fingers 26 which are coupled to a common potential. The conductive fingers 26 each include a substantially rectangular conductive strip which extends across the first major surface 25 of the semiconductor die 24. The conductive fingers 26 are arranged substantially parallel to one another.

The electronic component 20 further includes a first conductive layer 27 which is arranged on, and electrically coupled to, the at least two conductive fingers 26. The first conductive layer 27 extends from the at least two conductive fingers 26 over the first major surface 22 of the dielectric core layer 21. The first conductive layer 27 extends between base regions of the conductive fingers arranged on the semiconductor die 24 in order to electrically couple the conductive fingers 26 to one another. The first conductive layer 27 is arranged on both the semiconductor die 24 and the dielectric core layer 21 in which the semiconductor die 24 is embedded. The first conductive layer 27 is substantially planar, but may compensate for any height differences between the upper surface of the conductive fingers 26 and the first major surface 22 of the dielectric core layer 21.

The portion of the first conductive layer 27 extending over the first major surface 22 of the dielectric core layer 21 is substantially square or rectangular and extends into finger-like portions having a size and shape corresponding to the conductive fingers 26 of the semiconductor die 24 with which the first conductive layer 27 is electrically coupled. The first conductive layer 27 may be described as having a comb like outer contour, in which the teeth of the comb are arranged on, and electrically coupled to, the conductive fingers 26 arranged on the first major surface 25 of the semiconductor die 24.

The semiconductor die 24 may be a lateral transistor in which the least two conductive fingers 26 are coupled to either a source or a drain of the lateral transistor. The lateral transistor may be a gallium nitride-based HEMT (High Electron Mobility Transistor), for example. In embodiments in which the semiconductor die 24 is a lateral transistor, the electronic component 20 may include a further conductive layer 28 which is arranged on, and electrically coupled to, at least two further conductive fingers 29 which are coupled to a second common potential, which is electrically insulated from the first common potential. For example, the at least two conductive fingers 26 may be coupled to source and the two further conductive fingers 29 may be coupled to the drain of a transistor device. The further conductive fingers 29 are arranged substantially parallel to one another and substantially parallel to the at least two conductive fingers 26. The further conductive layer 28 also extends from the at least two conductive fingers 29 over the first major surface 22 of the dielectric core layer 21.

In some embodiments, such as that illustrated in FIG. 1a, the conductive fingers coupled to differing potentials are arranged alternately on the first major surface 25 of the semiconductor die 24 and may be considered to be interdigitated. In this embodiment, the first conductive layer 27 and the further conductive layer 28 may extend from opposing sides 30, 31 of the semiconductor die 24.

The dielectric core layer 21 may be provided by a prefabricated board, which may include a fibre reinforced matrix. For example, the dielectric core layer may include a glass fibre reinforced epoxy resin, such as FR4. The dielectric core layer may include PTFE (Polytetrafluoroethylene), PEN (Polyethylene Naphthalate), PET (Polyethylene Terephthalate, BT laminate (Bismaleimide-Triazine) or Polyimide, for example.

The conductive layer may include a metal, such as copper, or an alloy. The conductive fingers 26, 29 may form part of a metallisation structure which is deposited at the wafer level onto the semiconductor die 24. The conductive fingers 26, 29 may be provided by the uppermost layer of the metallisation of a multilayer metallisation structure. Alternatively, the conductive fingers 26, 29 may form part of a single layer metallisation structure of the semiconductor die 24.

In some embodiments, plurality of the conductive fingers coupled to a common potential are coupled to one another by a bus arranged on the first major surface 25 of the semiconductor die 24, for example in a peripheral region of the first major surface.

The first conductive layer 27 and the further conductive layer 28 may extend to opposing peripheral regions 32, 33 of the dielectric core layer 21, whereby the proximal end 34, 34' is arranged on the conductive fingers of the semiconductor die 24 and the distal end is arranged in the opposing peripheral regions 32, 33 of the dielectric core layer 21.

The distal end 35 of the first conductive layer 26 may provide an outer contact pad of the electronic component 20. In some embodiments, the first conductive layer 26 may be considered to provide a fan out redistribution structure for the electronic component 20.

The semiconductor die 24 may be embedded in the dielectric core layer 21 using various methods. For example, a prefabricated dielectric core layer 21 including a cured glass fibre reinforced epoxy resin may be provided and an aperture or a recess formed in the first major surface 22 having a lateral size, depth and shape for accommodating semiconductor die 24. The semiconductor die 24 may be placed in the recess or aperture and attached to the dielectric core layer 21 by adhesive or deposition of a further dielectric core layer in regions between the side faces of the semiconductor die 24 and the side faces defining the aperture or recess. Alternatively, the dielectric core layer may include a B-stageable material in the B-stage, for example a so-called pre-preg, in which the recess or aperture is formed. The semiconductor die 24 is placed in the recess or aperture and the dielectric core layer and semiconductor die 24 heat-treated, optionally under pressure, to be embed the semiconductor die 24 directly within the material forming the dielectric core layer 21.

The conductive layer 27 may be deposited by physical vapour deposition methods, such as sputtering or chemical deposition methods such as a electroplating and electroless plating. A combination of methods may also be used, for example a seed layer may be deposited by sputtering and a thicker conductive layer deposited on the seed layer by electroplating.

Figure 2A:
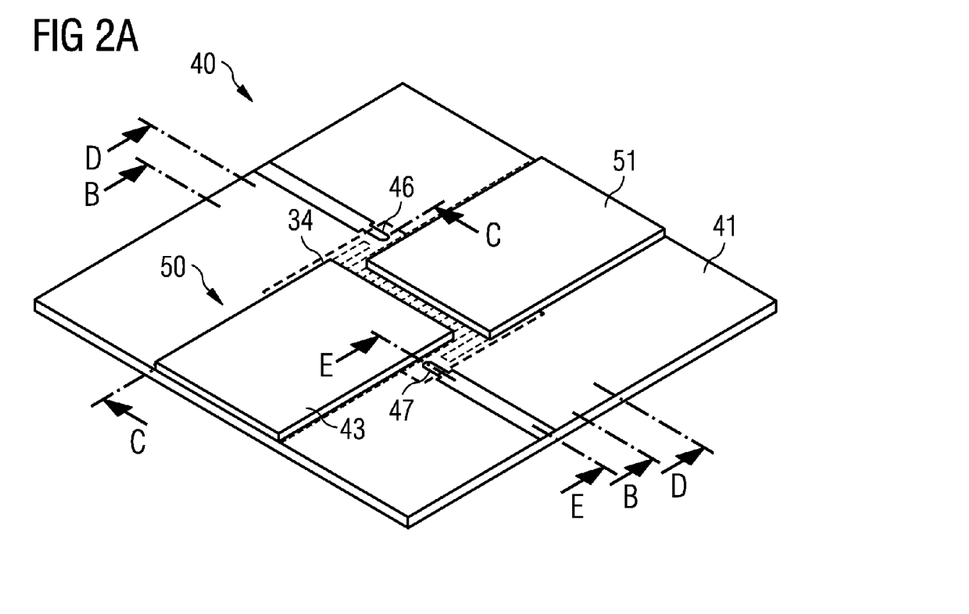
FIG. 2a illustrates a perspective view of an electronic component according to a second embodiment.
Figure 2B:
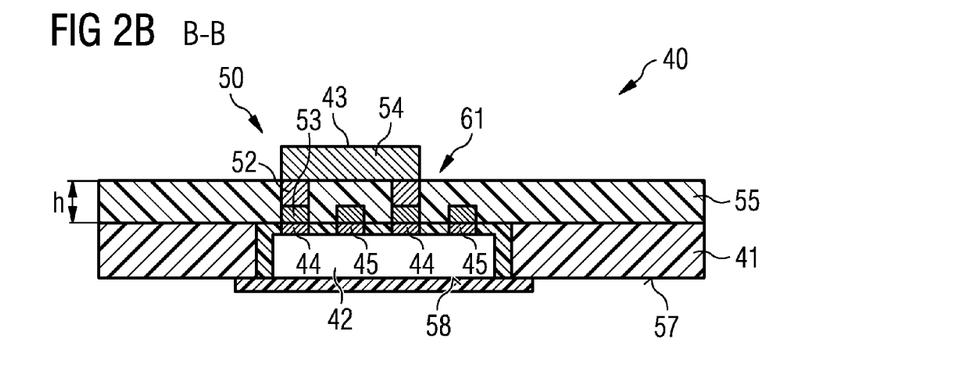

FIG. 2a illustrates a perspective view of an electronic component 40 according to a second embodiment. FIG. 2b illustrates a cross-sectional view along the line B-B and FIG. 2c a cross-sectional view along the line C-C of the electronic component 40 illustrated in FIG. 2a.

The electronic component 40 includes a dielectric core layer 41 and a semiconductor die 42 which is embedded in the dielectric core layer 41. The position of the semiconductor die 42 is illustrated in the top perspective view of FIG. 2A by a dashed line. The semiconductor die 42 includes, in this embodiment, a lateral transistor device and, in particular, a gallium nitride-based HEMT which includes a plurality of conductive fingers 44 coupled to source which are interdigitated by a plurality of fingers 45 coupled to drain and two gate pads 46, 47 arranged in two diagonally opposed corners of the upper surface 48 of the semiconductor die 42. The electronic component includes a multilayer redistribution structure 50 which, as illustrated in the top perspective view of FIG. 2a, includes two substantially rectangular and planar conductive portions 43, 51 extending from two opposing sides of the semiconductor die 42 to two opposing peripheral regions of the first major surface 52 of the dielectric core layer 41.

Figure 2C:
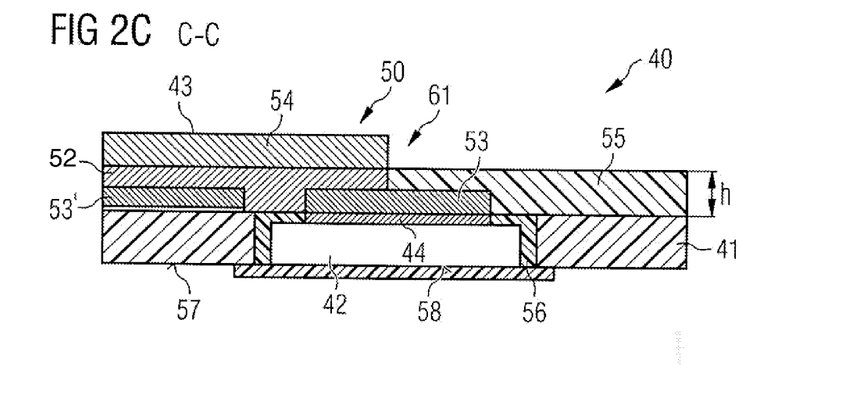

The first portion 43 is electrically coupled to the first plurality of conductive fingers 44 and to the source of the transistor lateral transistor 42. As can be seen in the cross-sectional view along the line B-B illustrated in FIG. 2b and the cross-sectional view along the line C-C which is illustrated in FIG. 2c, the source redistribution structure 61 of the multilayer redistribution structure 50 includes a first conductive layer 52 which is arranged on the conductive fingers 44 coupled to source and which extends to the periphery of the first major surface 52 of the dielectric layer 41.

A second conductive layer 53 is arranged on each of the conductive fingers 44 long substantially the entire length of the conductive fingers 44 underneath the first conductive layer 52. The first conductive layer 52 is arranged only on a portion of the second conductive layer 53 and a portion of the conductive fingers 44, in particular, a portion of the conductive fingers 44 which is adjacent the side edge of the semiconductor die 42. The second conductive layer 53 also includes a portion 53' which is arranged on the first major surface 52 of the dielectric core layer 41 in a region adjacent the semiconductor die 42. The second conductive layer 53 is, however, discontinuous so that the conductive fingers 44 are separate from the portion 53' of the second conductive layer 53 arranged on the dielectric core layer 41. The first conductive layer 52 extends between the portion 53' and portion 53 arranged on the conductive finger 44 and electrically couples the finger 44 to the portion 53'.

The redistribution structure 50 includes a third conductive layer 54 which is arranged on the first conductive layer 52 opposite to the second conductive layer 53. The third conductive layer 54 extends between portions of the first layer 52 arranged on the conductive fingers 44 and on the upper surface of the semiconductor die 42. As can be seen in the cross-sectional view illustrated in FIG. 2b, portions of the conductive fingers 45, which are coupled to drain, which are arranged underneath the third conductive layer 54.

The redistribution structure 50 includes a first dielectric layer 55 which is substantially coplanar with the upper surface of the first conductive layer 52. The first dielectric layer 55 extends over the portion of the conductive fingers 44 which remains uncovered by the first conductive layer 52 and extends over the portions of the conductive fingers 45, which are coupled to drain, which are arranged underneath the third conductive layer 54.

The arrangement of the first and second conductive layers 52, 53 and the dielectric layer 55 provides an arrangement in which the conductive layer 54 is arranged at a height h above the upper surface of the semiconductor die 42. For example, the height h may be around 20 µm if each of the conductive layers has a thickness of around 10 µm. In embodiments in which the conductive fingers have a thickness of around 5 µm, the lower surface of the third conductive layer 54 is arranged at a distance of around 25 µm, in this example, above the surface of the semiconductor material of the semiconductor die 42.

Figure 2D:
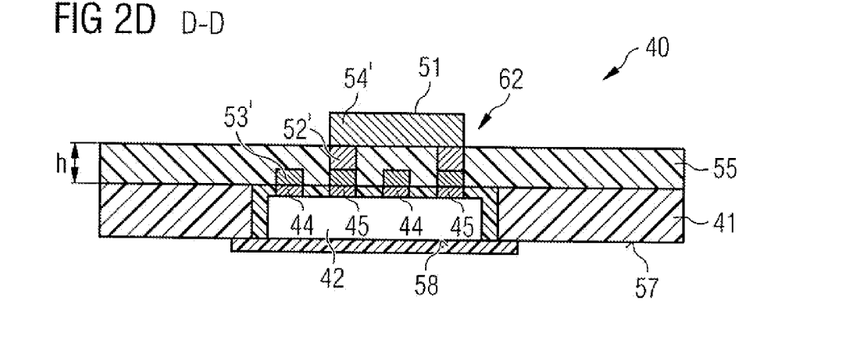

FIG. 2d illustrates a cross-sectional view along the line D-D of the electronic component illustrated in FIG. 2a and illustrates the drain redistribution structure 62 of the multi-layer distribution structure 50 of the lateral transistor. The electrical connection between the drain and the peripheral region of the dielectric core layer 41 has the same structure as that illustrated for the source connection. The conductive fingers 45 coupled to drain include a second conductive layer 53' arranged on the entire length of the conductive fingers 45, a first conductive layer 52' which is arranged on a portion of the length of the conductive fingers 45 and extends over the interface between the semiconductor die 42 and the dielectric core layer 41 and a third conductive layer 54' which extends between the finger-like portions of the first conductive layer 52' arranged on the semiconductor die. The third conducive layer also extend over the first conductive layer 52' arranged on the dielectric core layer 41.

The semiconductor die 42 is arranged in an aperture formed in the dielectric core layer 41. The semiconductor die 42, in regions between the conductive fingers 44, may be covered by a dielectric layer 56 which may also be arranged on the lower surface 57 of the dielectric core layer 41 and the rear surface 58 of the semiconductor die 42.

The redistribution structure 50 further includes a conductive connection between each of the gate pads 46, 47 and a peripheral edge region of the dielectric core layer 41. In this embodiment, the conductive connection for the gate pads 46, 47 extend from two opposing sides of the semiconductor die 42 and substantially perpendicular to the two conductive connections for the source and drain.

Figure 2E:
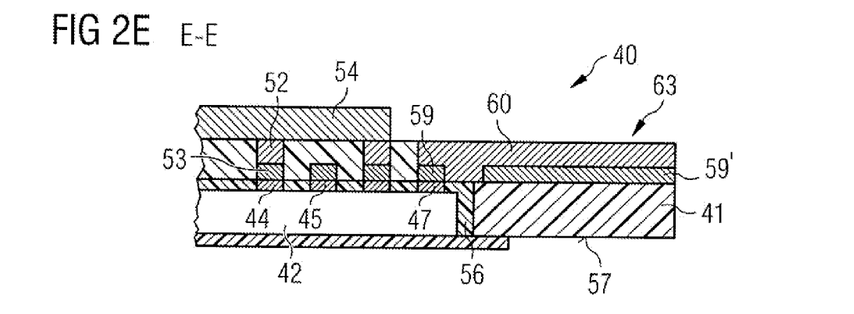

FIG. 2e illustrates a cross-sectional view along the line E-E of the electronic component illustrated in FIG. 2a and illustrates the connection between the gate pad 47 and the peripheral edge of the dielectric core layer 41.

The redistribution structure 63 for the gate 47 includes a first conductive layer 59 having a thickness corresponding to the second conductive layer 53. The second conductive layer includes a portion 59 arranged on the gate pad 47 on the semiconductor die 42 and a separate portion 59' arranged on the first major surface 52 of the dielectric core layer 41. Two portions 59, 59' are electrically coupled by a second conductive layer 60 which extends from the gate pad 47 and the first portion 59 over the semiconductor die 42 and first major surface of the dielectric layer 41 and over the second portion 59' of the first conductive layer 52. The gate redistribution structure 63 includes two conductive layers whereas the redistribution structures 61, 62 for the source and drain include three conductive layers.

Figure 3:
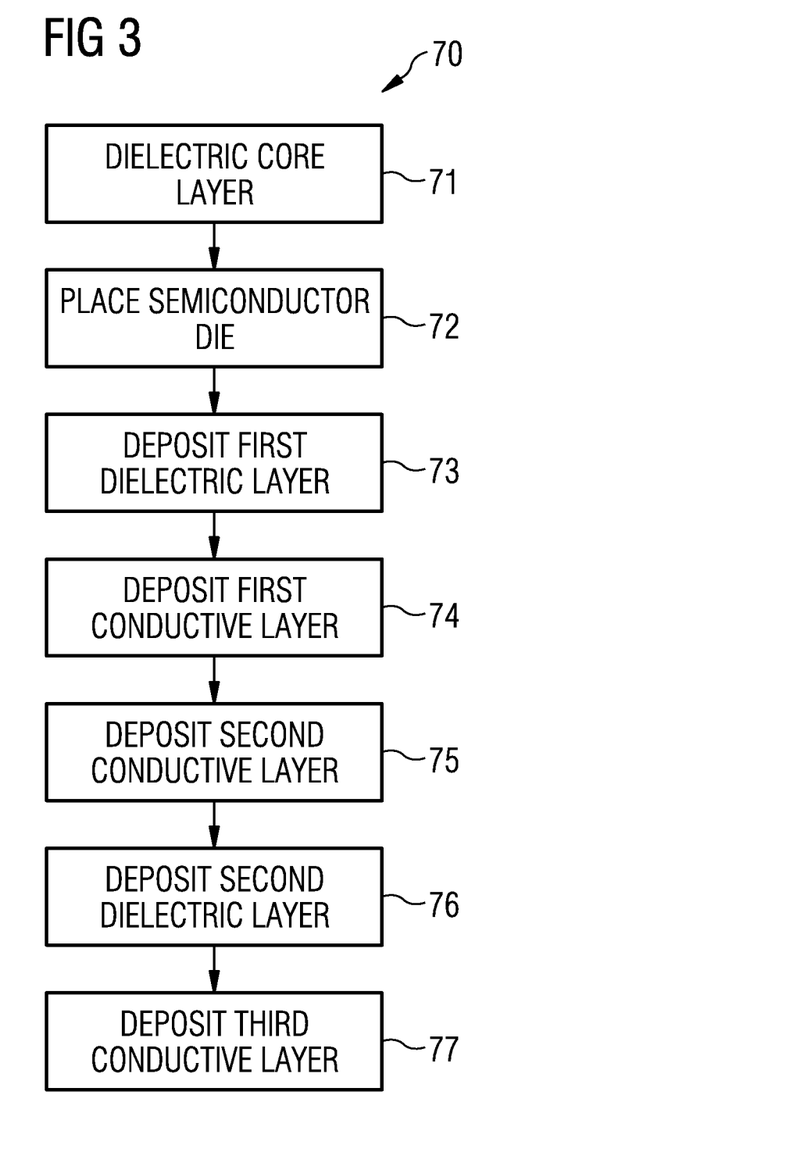
FIG. 3 illustrates a flow diagram for fabricating an electronic component.

FIG. 3 illustrates a flow diagram of a method 70 for fabricating an electronic component. In box 71, a dielectric core layer including a recess or aperture is provided. The dielectric core layer may be formed from a portion of a printed circuit board material, such as glass fibre reinforced epoxy resin. The recess or aperture may be sized and shaped to accommodate a semiconductor die within its volume. The dielectric core layer may include a laminate and include one or more conductive traces arranged on the major surface of the dielectric core layer adjacent the recess or aperture.

In box 72, the semiconductor die is placed in the aperture or recess in the dielectric core layer. The upper surface of the semiconductor die may include a metallization structure which is electrically coupled to a semiconductor device of the semiconductor die.

In box 73, a first dielectric layer is deposited on the upper surface of the semiconductor die and in regions between the semiconductor die and walls defining the aperture or recess. The first dielectric layer may also be applied to the opposing side of the dielectric core layer to cover the rear surface of the semiconductor die. At least one portion of the uppermost metallisation layer of the semiconductor die remains exposed from the first dielectric layer. The exposed portion or portions of the metallization layer provide contact pads for electrically coupling the semiconductor die to a rewiring structure arranged on the dielectric core layer. The rewiring structure may include conductive traces arranged on the dielectric core layer.

In box 74, a first conductive layer is deposited onto the metallisation layer on the semiconductor die. The first conductive layer may also be deposited on the first major surface of the dielectric core layer, for example on the conductive traces. The first conductive layer increases the thickness of the metallization layer and conductive traces of the dielectric core layer, but is not used to electrically couple two or more conductive regions. The semiconductor die is electrically insulated from the conductive traces after deposition of the first conductive layer.

In box 75, a second conductive layer is deposited which extends from the metallisation structure on the semiconductor die to the conductive portions on the dielectric core layer. The second conductive layer electrically couples the metallisation structure of the semiconductor die to the conductive portions arranged on the dielectric core layer.

In box 76, a second dielectric layer may be deposited in regions between portions of the second conductive layer. The second dielectric layer may be deposited on regions of the semiconductor die uncovered by the second conductive layer and regions of the dielectric core layer and first dielectric layer which are uncovered by the second conductive layer. The second dielectric layer may have a planarisation function such that the upper surface of the second conductive layer and the second dielectric layer are substantially coplanar.

In box 77, a third conductive layer may be deposited on portions of the second conductive layer or on the entire area of the second conductive layer.

The method is used to create a package for the semiconductor die including the dielectric core layer and a conductive redistribution structure which electrically couples the semiconductor die with conductive portions arranged adjacent the semiconductor die on the dielectric core layer. The conductive redistribution structure includes two or three conductive layers having differing lateral forms.

The conductive layers may be formed by electrodeposition techniques and may include copper. The dielectric layers may include a photostructurable material such as polyimide.

The aperture may be formed in the dielectric core layer by laser drilling, machining or stamping.

The semiconductor die may include a lateral transistor device such as a gallium nitride-based HEMT.

The second conductive layer may be used to electrically couple isolated conductive regions on the semiconductor die to one another. For example, in embodiments in which the semiconductor die includes a lateral transistor, a plurality of conductive fingers, which are to be coupled to a common potential, may be provided on the semiconductor die. For example, a plurality of conductive fingers may be coupled to source and a further plurality of conductive fingers may be coupled to drain. The plurality of conductive fingers coupled to source may be electrically coupled to one another by the second conductive layer. In some embodiments, the first conductive layer may be used to electrically couple conductive fingers coupled to a common potential to one another. In other embodiments, the conductive fingers may be electrically coupled to one another by a conductive bus which forms part of the metallisation on the semiconductor die.

The first and second conductive layers increase the thickness of the conductive redistribution structure both on the semiconductor die and on the dielectric core layer and space the third conductive layer from the semiconductor material of the semiconductor die. The first and second dielectric layers in combination with the increased distance between the third conductive layer and the semiconductor die provided by the first and second conductive layers may be used to provide increased electrical insulation between the third conductive layer and the upper surface of the semiconductor die.

The second conductive layer may include a plurality of finger-like portions which are arranged on at least a portion of the length of the conductive fingers of the semiconductor die. The third conductive layer may extend directly between these finger portions and extend over the surface of the second dielectric layer arranged between the finger-like portions of the second conductive layer. The conductive portions of the redistribution structure arranged on the dielectric core layer may extend to the periphery of the dielectric core layer of the electronic component and may provide outer contact pads for the electronic component.

Whilst the methods described herein are described in terms of a single electronic component, the methods may be carried out on many components, for example on a large board including many, typically hundreds, of electronic component positions. After completion of the fabrication method, the electronic components are singulated from the panel.

The methods described in connection with FIG. 3 may be used to fabricate an electronic component including different types of semiconductor devices. In some embodiments, the semiconductor die of the electronic component includes a lateral transistor, and in some embodiments, a gallium nitride-based HEMT.

An embodiment in which the electronic component including gallium nitride-based HEMT now be described in conjunction with FIGS. 4 to 10.

Figure 4:
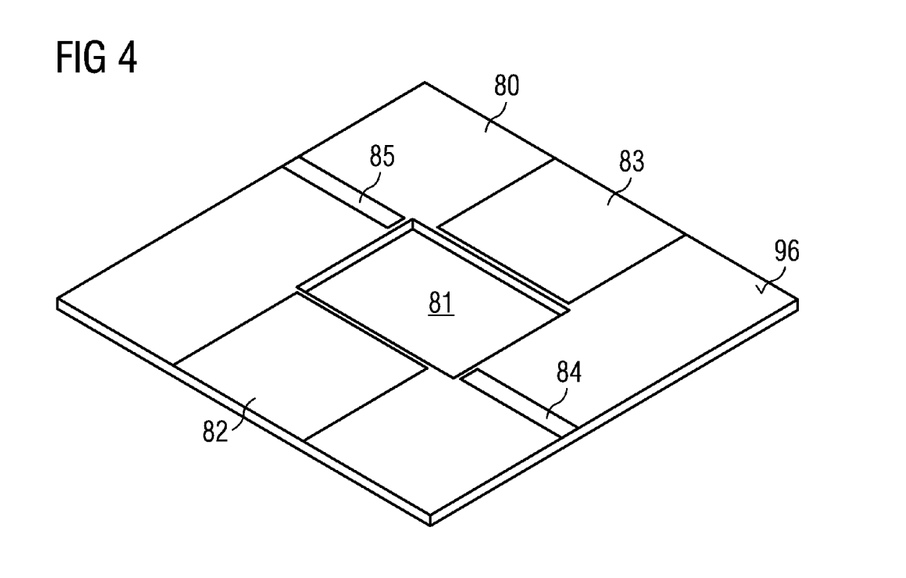
FIG. 4 illustrates a dielectric core layer.

FIG. 4 illustrates a perspective view of a dielectric core layer 80 which includes an aperture or through-hole 81 which is substantially rectangular. The thickness of the dielectric core layer 80 may be substantially the same as the thickness of the semiconductor die which is to be embedded in the aperture 81. In this embodiment, the dielectric core layer 80 further includes conductive traces on its upper surface which are arranged adjacent the aperture 81. A conductive trace 82, 83 is arranged adjacent each of the long sides of the aperture 81, which has a width which substantially corresponds to the width of the aperture 81 and extends perpendicularly to the conductive traces 82, 83. The conductive traces 82, 83 run at 180°. A narrower strip like conductive trace 85 is arranged adjacent the two short sides of the aperture 81. Each of the conductive traces 82, 83, 84, 85 extends substantially perpendicularly to the side face of the aperture 81 to the periphery of the dielectric core layer 80. The two large conductive portions 82, 83 are suitable for providing an electrical connection for a current electrode and the two narrow strip like portions 84, 85 are suitable for providing connections to a control electrode or sense function of a transistor device arranged in the aperture 81.

Figure 5:
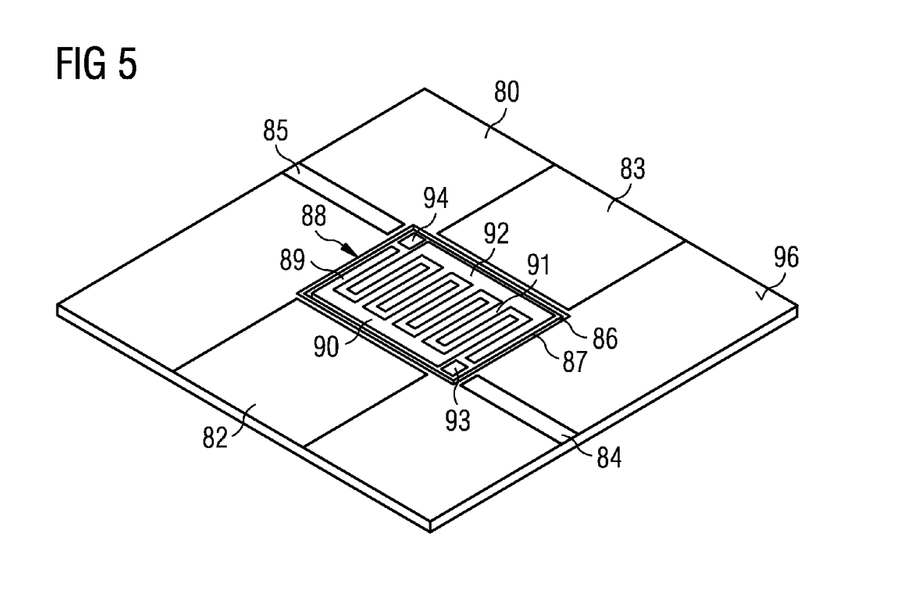
FIG. 5 illustrates the semiconductor die arranged in an aperture in the dielectric core layer.

FIG. 5 illustrates a semiconductor die 86 including a gallium nitride based HEMT arranged in the aperture 81 in the dielectric core layer 80. The semiconductor die 86 is placed in the aperture 81 such that its upper surface 87 is substantially coplanar with the upper surface 96 of the dielectric core layer. The semiconductor die 86 may be supported in the aperture by a heat-release tape, for example, which is removed after the semiconductor die 86 has been secured in the aperture 81 of the dielectric core layer 80. The upper surface 87 of the semiconductor die 86 includes a metallisation structure 88 including a plurality of first conductive fingers 89 coupled to a bus 90 which are interdigitated with a plurality of second conductive fingers 91 coupled to a second bus 92. The buses 90, 92 are arranged in opposing peripheral regions of the semiconductor die 86. The first conductive fingers 89 may be coupled to source and the second conductive fingers 91 may be coupled to drain. The width of the conductive portions 82, 83 arranged on the dielectric layer 80 substantially corresponds to the length of the bus 90, 92, respectively. The semiconductor die 86 includes two gate pads 93, 94 which are arranged adjacent the conductive portions 84, 85.

Figure 6A:
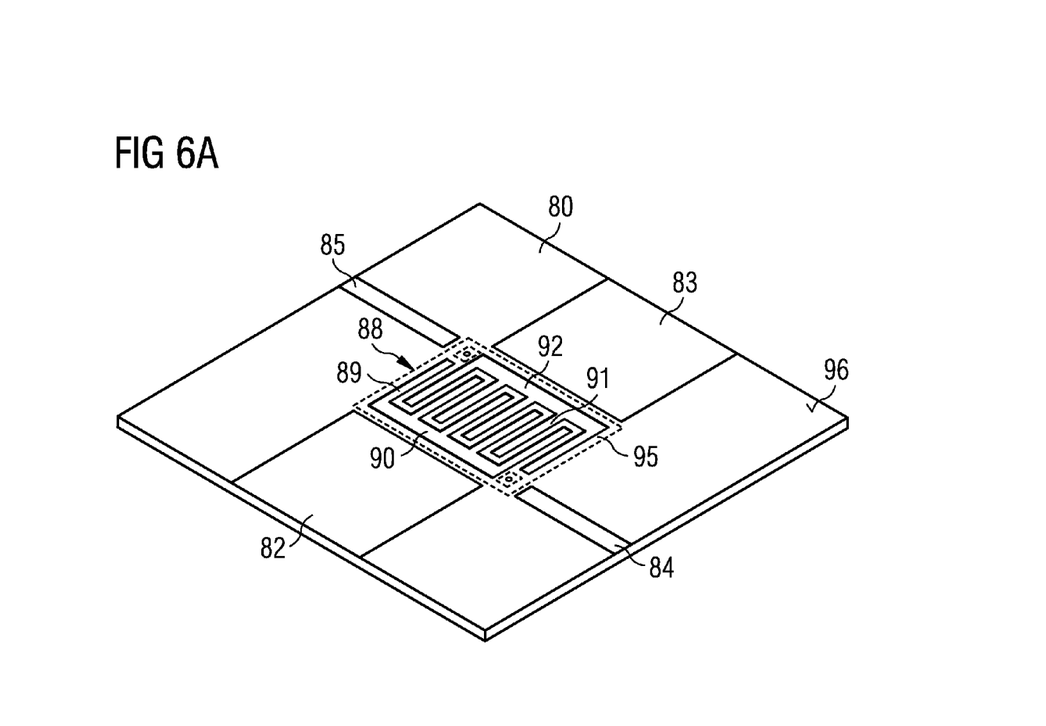
FIG. 6a illustrates a perspective view of the top surface of an assembly including the dielectric core and semiconductor die layer after the deposition of the first dielectric layer.
Figure 6B:
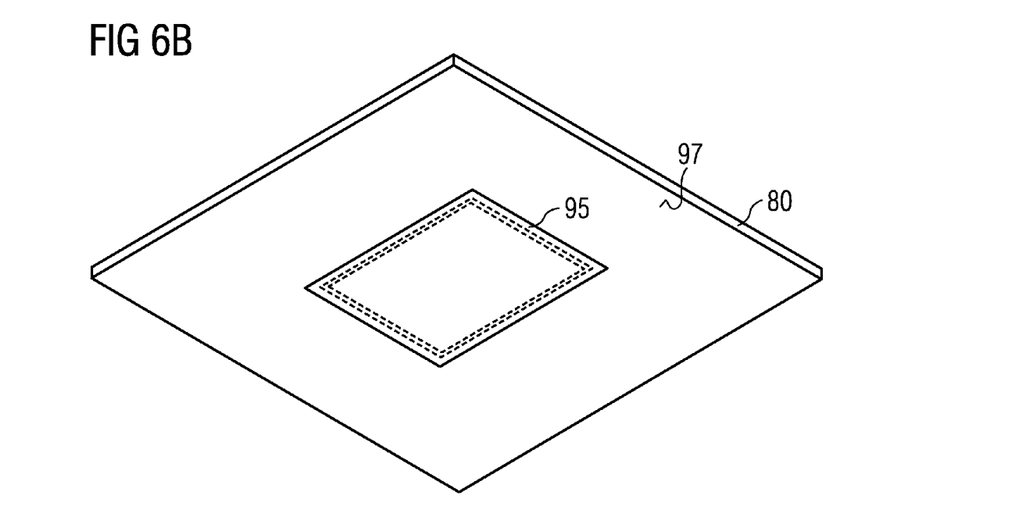
FIG. 6b illustrates a perspective view of the bottom surface of the assembly including the first dielectric layer.

FIG. 6*a* illustrates a perspective view of the top surface and FIG. 6*b* a perspective view of bottom surface of the dielectric core layer 80 after the deposition of a first dielectric layer 95. The first dielectric layer 95 is deposited in regions at the periphery of the semiconductor die 86 between the side faces of the semiconductor die 86 and side faces of the dielectric core layer 80 defining the aperture 81. The first dielectric layer 95 may be used to secure the semiconductor die 86 in the aperture 81.

The first dielectric layer 95 is further deposited on the first major surface 87 of the semiconductor die 86 such that regions of the metallisation structure 88 are exposed from the first dielectric layer 95. These exposed regions of the metallisation structure 88 are to be electrically coupled to the conductive traces 82, 83, 84, 85 on the dielectric core layer 80. The first dielectric layer 95 may also be applied to regions of the dielectric core layer 80 arranged between the conductive traces 82, 83, 84, 85 and may provide a planarizing function. The thickness of the first dielectric layer 95 may be substantially the same as the thickness of the conductive traces 82, 83, 84, 85.

The first dielectric layer 95 may also be applied to the rear surface of the semiconductor die 86 and the rear surface 97 of the dielectric core layer 80. In this embodiment, the first dielectric layer 95 arranged on the rear surface 97 of the dielectric core layer 80 has a lateral extent such that it covers a small region around the aperture 81. The first dielectric core layer 95 may be used to secure the semiconductor die 86 within the aperture 81 and embed the semiconductor die within the dielectric core layer 80. A portion of the rear surface of the semiconductor die 86 may remain exposed from the dielectric layer 95 and may be electrically coupled to a further conductive trace and/or ground.

Figure 7:
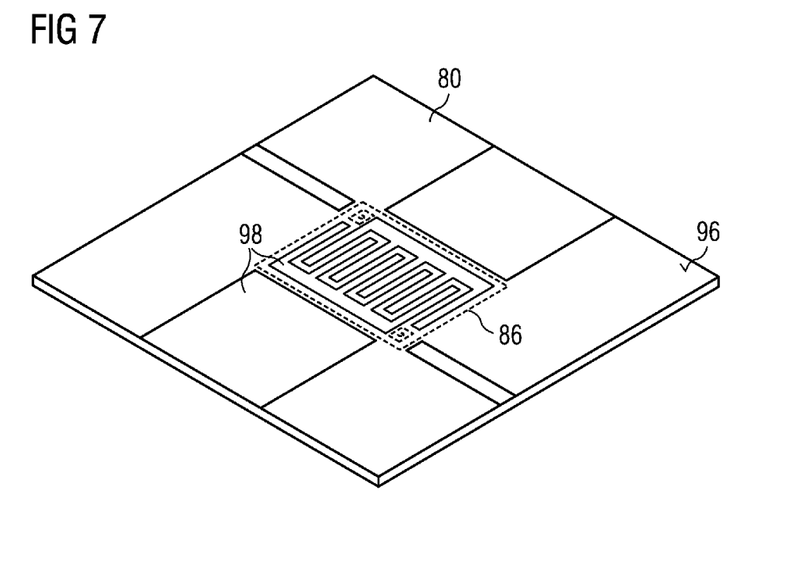
FIG. 7 illustrates the dielectric core layer after deposition of a first conductive layer.

FIG. 7 illustrates the dielectric core layer 80 with the embedded semiconductor die 86 after deposition of a first conductive layer 98. The first conductive layer 98 is arranged on the regions of the metallisation layer 88 which are exposed from the first dielectric layer 95. The first conductive layer increases the thickness of the metallisation layer 88 of the semiconductor die 86 above the upper surface of the first dielectric layer 95. The first conductive layer may also be deposited on the conductive traces 82, 83, 84, 85 arranged on the upper surface of the dielectric core layer 80. After deposition of the first conductive layer, the semiconductor die 86 is not electrically coupled to the conductive traces 82, 83, 84, 85.

Figure 8:
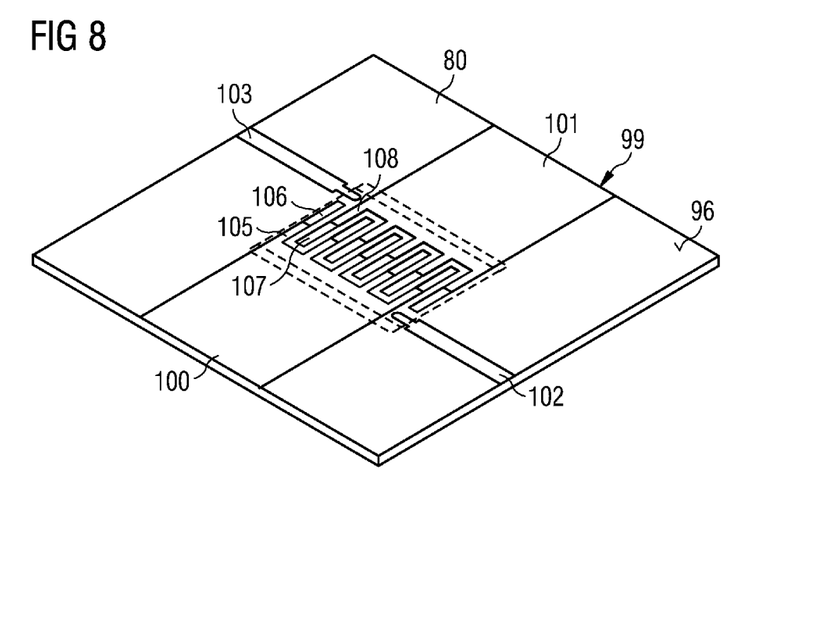
FIG. 8 illustrates the dielectric core layer after deposition of a second conductive layer.

FIG. 8 illustrates the assembly after deposition of a second conductive layer 99. The second conductive layer 99 includes four portions. A first portion 100 is arranged on the conductive fingers 89 of the metallisation structure which are coupled to source and extends from the conductive fingers 89 over the interface between the semiconductor die 86 and the dielectric core layer 81 and on the conductive trace 82 arranged on the dielectric core layer 80 such that each of the conductive fingers 89 is electrically coupled to the conductive trace 82. The second conductive layer 99 is arranged on only a portion of the length, for example slightly less than half, of the conductive fingers 89 which is adjacent to the conductive trace 82. The first portion 100 may be described as having a comb-like form including finger-like portions 105. The distal portion 106 of the conductive fingers 89 remains uncovered by the first portion 100.

The second portion 101 of the second conductive layer 99 has a similar arrangement and is arranged on only portions of the conductive fingers 91 coupled to drain which are adjacent the conductive trace 83. The second portion 101 of the second conductive layer 99 also extends from the conductive fingers 91 over the interface between the semiconductor die 86 and the dielectric core layer 80 is arranged on the conductive trace 83 to electrically couple the drain of the transistor device to the conductive portion 83. The second portion 100 may also be described as having a comb-like form including finger-like portions 108. The distal portions 107 of the conductive fingers 91 remain uncovered by the second portion 100.

A third portion 102 of the second conductive layer 99 is electrically coupled to the gate pad 93 and extends from the gate pad 93 over the interface between semiconductor die 86 and the dielectric core layer 80 and electrically couples the gate pad 93 to the conductive trace 84.

The second gate pad 94 is electrically coupled to the conductive trace 85 arranged on the dielectric core layer 80 by a fourth portion 103 of the conductive layer 99 which extends from the gate pad 94 over the dielectric core layer to the conductive trace 85. The lateral extent of the second conductive layer 99 in regions of the dielectric core layer 80 substantially corresponds to the lateral extent of the underlying conductive traces 82, 83, 84, 85.

Figure 9:
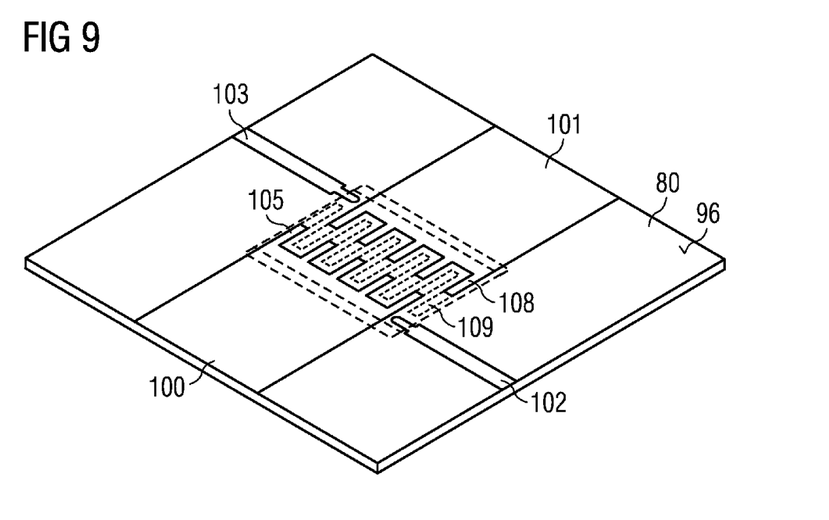
FIG. 9 illustrates the dielectric core layer after deposition of a second dielectric layer.

FIG. 9 illustrates the assembly after deposition of a second dielectric layer 109. The second dielectric layer 109 is arranged on portions of the semiconductor die 86 which are uncovered by the second conductive layer 99. The second dielectric 109 is arranged on the distal portions 106, 107 of the conductive fingers and between the conductive finger-like portions 105, 108 of the second conductive layer. The second dielectric layer 109 is also arranged on the surface of the dielectric core layer 80 between the conductive portions 100, 101, 102, 103 of the second conductive layer 99 and may provide a planarisation function by having a thickness substantially corresponding to the thickness of the second conductive layer 99. The second dielectric layer 109 is arranged between the distal ends of the finger-like portions 105, 108 of the second conductive layer such that the distal ends of the two conductive portions 100, 101 are laterally spaced apart by a distance.

The first dielectric layer 95 may have a thickness of about 5 μm to about 20 μm and the second dielectric layer 109 may have a thickness of about 5 μm to about 30 μm. A dielectric layer may also be present on the upper surface of the die and may have a thickness of about 5 μm. The thickness of the combination of dielectric layers may be selected to adjust the parasitic capacitance in relation to source and drain.

Figure 10:
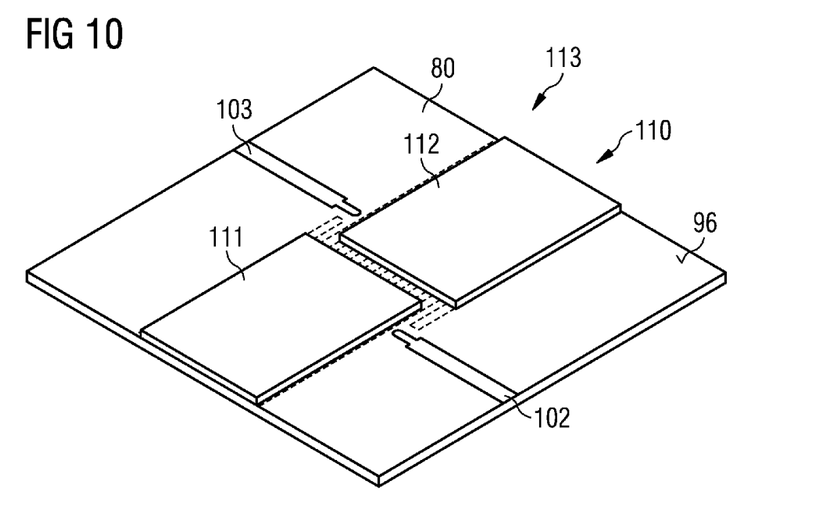
FIG. 10 illustrates the dielectric core layer after deposition of a third conductive layer.

FIG. 10 illustrates the assembly after deposition of a third conductive layer 110. The third conductive layer 110 includes two portions 111, 112, each of which is substantially rectangular. The conductive portion 111 is arranged on the conductive portion 100 of the second conductive layer and extends between the finger-like portions 105 on the semiconductor die 86. The conductive portion 111 is arranged on regions of the second dielectric layer 109 positioned between the conductive fingers 105. The conductive portion 102 also has a substantially rectangular shape and is arranged on the conductive finger portions 108 of the portion 101 of the second conductive layer 99. The two conductive portions 111, 112 are spaced apart from each other and extend from opposing sides of the semiconductor die 86 to the periphery of the dielectric core layer 80.

The portions 111, 112 provide power metal tracks and may be used to improve the electrical and thermal connection to the underlying semiconductor die 86. The thickness of the portions 111, 112 may be greater than that of the underlying conductive layers as the arrangement of the first and second conductive layers enables a coarser track structure and removes the need to create fine pitch connections in this conductive layer. The portions 111, 112 also enable cooling structures to be provided which are arranged directly on the semiconductor die 86. The third conductive layer 110 may provide a robust connection to the source and drain electrodes of the transistor device of the semiconductor die 86.

In this embodiment, the portions 102, 103 of the second conductive layer which are electrically coupled to the gate pads 93, 94 of the semiconductor die 86 remain uncovered by the third conductive layer. The arrangement illustrated in FIG. 10 may be used as an electronic component 113.

The electronic component, such as that illustrated in FIGS. 1, 2 and 10 is not limited to including a single semiconductor die and may include more than one semiconductor die embedded in the dielectric core layer. Each semiconductor die may be embedded in a separate recess or aperture. The two or more semiconductor dice may be electrically coupled to one another by conductive tracks applied onto the semiconductor dice which extend over a portion of the dielectric core layer in order to provide a desired circuit or portion of the circuit. For example, two transistor devices may be electrically coupled to provide a half bridge circuit or a cascode configuration. A control chip may be embedded in the dielectric core layer and electrically coupled to one or more transistor devices in order to control the switching of the transistor devices.

The electronic component 113 may also be further processed to provide different application forms. Three examples of application forms are illustrated in FIG. 11.

A portion of the outermost surfaces of the outermost conductive layer may be used to provide contact pads for the electronic component so that the electronic component is surface mountable. The electronic component may be mounted on the circuit board using solder or conductive adhesive. Remaining portions of the outermost conductive layer may be covered by a further dielectric layer which may also define the contact pads of the electronic component.

Figure 11A:
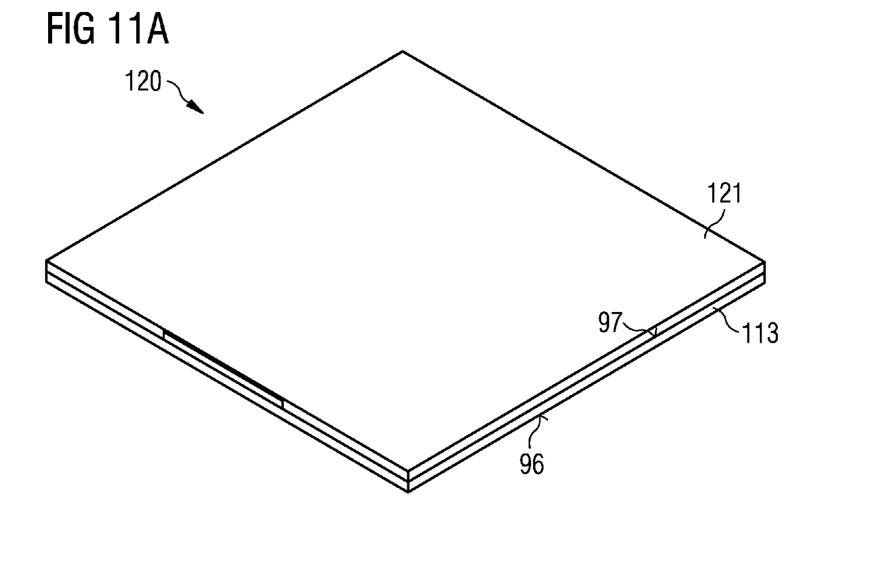
FIG. 11a illustrates a first application form of the electronic component.
Figure 11B:
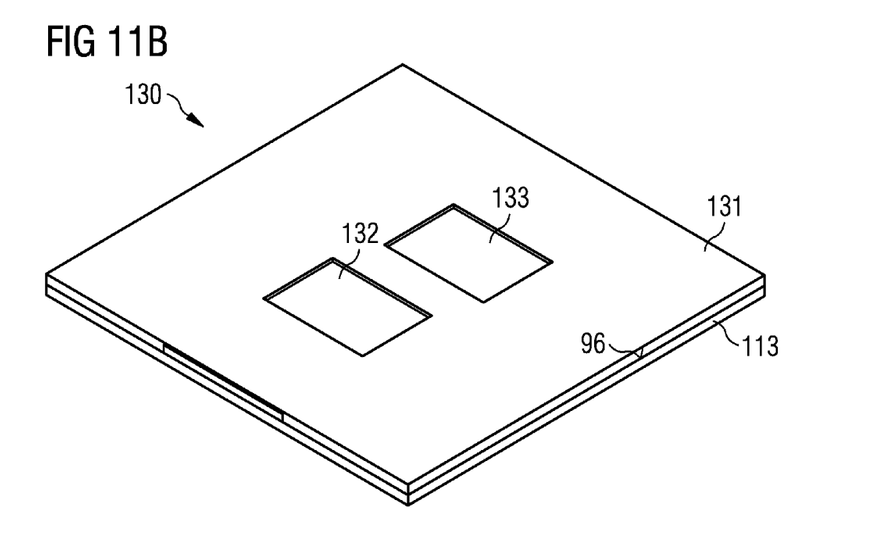
FIG. 11b illustrates a second application form of the electronic component.
Figure 11C:
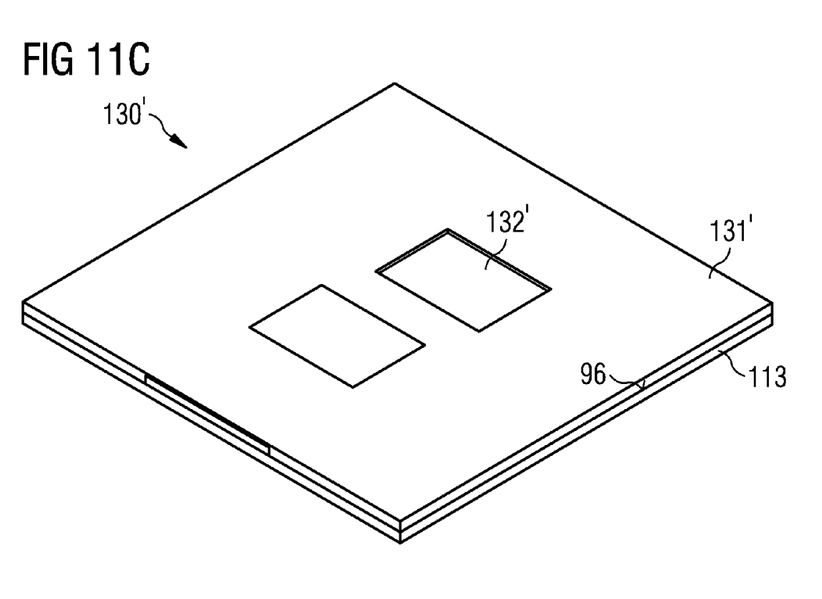
FIG. 11c illustrates a third application form of the electronic component.

FIG. 11a illustrates an application form 120 in which a heatsink 121 is applied to the dielectric core layer 80. The heatsink 121 may be a metallic or alloy foil or plate and may further include a heat dissipating layer which is configured to dissipate heat generated by the semiconductor die 86 laterally. The heat dissipation layer may include a material having an anisotropic thermal conductivity.

The electronic component 113 with or without additional dielectric layers and a heatsink may be mounted in a recess of a printed circuit board and connected to the circuit board by conductive vias and/or traces.

FIG. 11b illustrates a second application form 130 of the electronic component 80 which includes a dielectric layer 131 arranged on the upper surface 96 of the dielectric layer 80. Apertures in the dielectric layer may be provided to underlying portions of the redistribution structure arranged on the upper surface 96 of the electronic component. In the embodiment illustrated in FIG. 11b, two apertures 132, 133 arranged in the dielectric layer 131 to expose regions of the conductive redistribution layer arranged on the upper surface 96 of the electronic component 80. FIG. 11c illustrates a third application form 130' of the electronic component 80 which includes a dielectric layer 131 5 including a single aperture 132'. The contacts may be soldered onto a circuit board or may be electrically coupled to the circuit board by a mixture of solder contacts and conductive vias.

GaN-based devices such as GaN-based HEMT devices can offer high power densities and improved switching behaviours in many applications over their silicon based counterparts. GaN-based devices are lateral devices so that both source/emitter and drain/collector connection are disposed on the same surface.

The package of the electronic components according to some of the embodiments described herein provides at least one of the following features: a low electrical resistance fine pitch interconnect to the interdigitated fingers of the lateral device; a large area connect to the device, such as wide, thick tracks; good thermal cooling to the semiconductor die surface incorporating thermal capacitance and thermal conductivity, a high voltage standoff between contacts so a good dielectric withstand and low capacitive coupling between terminals.

At the die level, interdigitated fingers coupled to source and drain are on fine pitches of down to 5 μm thickness and 5 μm gap between these tracks. At these pitches it is relatively difficult to get the power out from a long finger. One solution is to provide top metallization schemes laid out on a "checker-board" type connection pattern consisting of at least two metal layers. The principal of this arrangement is relatively simple with the lateral fingers of the device running in one place (Y-axis for example). An additional set of much coarser and thicker fingers running at 90° (X-axis for example). A dielectric layer between the two metallization layers with alternating vias connecting each of fingers running in the X-axis down to the correct finger running in the Y-axis. However, for these types of schemes, the parasitic capacitance generated is not desirable.

In the embodiments described herein in which two or more conductive layers are provided, the conductive layers do not cross one another above the active region of the device. Furthermore, the source and drain connections are arranged on opposing sides of the transistor device and may be arranged entirely on the dielectric core layer providing the package for the semiconductor die. This layout for the conductive redistribution structure may be used to assist in reducing parasitic capacitance.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
   a dielectric core layer having a first major surface,
   a semiconductor die embedded in the dielectric core layer, the semiconductor die comprising a first major surface and at least two conductive fingers arranged on the first major surface which are coupled to a same first common potential,
   a first conductive layer arranged on, and electrically coupling the at least two conductive fingers to each other, and extending from the at least two conductive fingers over the first major surface of the dielectric core layer.

2. The electronic component according to claim 1, wherein
   the semiconductor die comprises a lateral transistor.

3. The electronic component according to claim 2, wherein the at least two conductive fingers are coupled to a source or a drain of the lateral transistor.

4. The electronic component according to claim 2, wherein
   the lateral transistor is a GaN-based HEMT (High Electron Mobility Transistor).

5. The electronic component according to claim 1, further comprising at least two further conductive fingers interdigitated with the at least two conductive fingers, wherein the at least two further conductive fingers are coupled to a same second common potential.

6. The electronic component according to claim 1, wherein the first conductive layer has a proximal end arranged on the at least two conductive fingers and a distal end arranged at the periphery of the dielectric core layer.

7. The electronic component according to claim 1, wherein
   the at least two conductive fingers have a length and a portion of the length is uncovered by the first conductive layer.

8. The electronic component according to claim 1, further comprising a second conductive layer arranged on the at least two conductive fingers and underneath the first conductive layer.

9. The electronic component according to claim 8, wherein
   the at least two conductive fingers have a length, the second conductive layer is arranged on substantially the entire length of the at least two conductive fingers and a portion of the length is uncovered by the first conductive layer.

10. The electronic component according to claim 1, further comprising a first conductive portion arranged on the first conductive layer and extending between the at least two conductive fingers over the semiconductor die.

11. The electronic component according to claim 10, wherein the first conductive portion is arranged at least 20 μm above the surface of the semiconductor die.

12. The electronic component according to claim 10, wherein
   the first conductive portion has a proximal end arranged on the semiconductor die and a distal end arranged at the periphery of the dielectric core layer.

13. The electronic component according to claim 12, wherein
   the distal end comprises an outer contact pad of the electronic component.

14. The electronic component according to claim 10, wherein the first conductive portion is arranged on, and is electrically insulated from, distal portions of at least two further conductive fingers that are interdigitated with the at least two conductive fingers, and wherein the at least two further conductive fingers are coupled to a same second common potential.

15. The electronic component according to claim 14, further comprising a second conductive portion arranged laterally adjacent and spaced apart from the first conductive portion, the second conductive portion being electrically coupled to the at least two further conductive fingers and extending between the at least two conductive fingers over the semiconductor die and extending to the periphery of the dielectric core layer.

16. The electronic component according to claim 15, wherein the second conductive portion is arranged on, and is electrically insulated from distal portions of the at least two first conductive fingers.

17. The electronic component according to claim 15, wherein the second conductive portion is arranged at least 20 μm above the surface of the semiconductor die.

18. The electronic component according to claim 15, wherein the second conductive portion and the first conductive portion extend from opposing sides of the semiconductor die.

19. A method of producing an electronic component, comprising:
   applying a first conductive layer to at least two conductive fingers arranged on a first surface of a semiconductor die embedded in a dielectric core layer, the at least two conductive fingers being coupled to a same first common potential, the first conductive layer extending from the at least two conductive fingers over the first major surface of the dielectric core layer.

20. The electronic component according to claim 1, wherein the at least two conductive fingers are coupled to a source or a drain of a transistor included in the semiconductor, and wherein further conductive fingers interdigitated with the at least two conductive fingers are coupled to the other one of the source or the drain.

21. The electronic component according to claim 1, further comprising:
   a second conductive layer arranged on the at least two conductive fingers and underneath the first conductive layer, the second conductive layer being arranged on substantially an entire length of the at least two conductive fingers while a portion of the entire length is uncovered by the first conductive layer, and
   a first conductive portion arranged on the first conductive layer and extending between the at least two conductive fingers over the semiconductor die.

22. The electronic component according to claim 1, further comprising:
   a second conductive layer arranged on the at least two conductive fingers and underneath the first conductive layer, the second conductive layer being arranged on substantially an entire length of the at least two conductive fingers while a portion of the entire length is uncovered by the first conductive layer,
   a first conductive portion arranged on the first conductive layer and extending between the at least two conductive fingers over the semiconductor die, the first conductive portion being electrically insulated from distal portions of at least two further conductive fingers that are interdigitated with the at least two conductive fingers, wherein the at least two further conductive fingers are coupled to a same second common potential, and
   a second conductive portion arranged laterally adjacent and spaced apart from the first conductive portion, the second conductive portion being electrically coupled to the at least two further conductive fingers and extending between the at least two conductive fingers over the semiconductor die and extending to the periphery of the dielectric core layer,
   wherein the first common potential is supplied by a source of a transistor included in the semiconductor, and
   wherein the second common potential is supplied by a drain of the transistor.

23. The electronic component according to claim 1, further comprising:
   a second conductive layer arranged on the at least two conductive fingers and underneath the first conductive layer, the second conductive layer being arranged on substantially an entire length of the at least two conductive fingers while a portion of the entire length is uncovered by the first conductive layer,
   a first conductive portion arranged on the first conductive layer and extending between the at least two conductive fingers over the semiconductor die, the first conductive portion being electrically insulated from distal portions of at least two further conductive fingers that are interdigitated with the at least two conductive fingers, wherein the at least two further conductive fingers are coupled to a same second common potential, and
   a second conductive portion arranged laterally adjacent and spaced apart from the first conductive portion, the second conductive portion being electrically coupled to the at least two further conductive fingers and extending between the at least two conductive fingers over the semiconductor die and extending to the periphery of the dielectric core layer,
   wherein the first common potential is supplied by a drain of a transistor included in the semiconductor, and
   wherein the second common potential is supplied by a source of the transistor.

* * * * *